United States Patent [19]
Yamashita et al.

[11] Patent Number: 5,763,293
[45] Date of Patent: Jun. 9, 1998

[54] PROCESS OF FABRICATING A THERMOELECTRIC MODULE FORMED OF V-VI GROUP COMPOUND SEMICONDUCTOR INCLUDING THE STEPS OF RAPID COOLING AND HOT PRESSING

[75] Inventors: Hiroyuki Yamashita; Yuma Horio; Toshiharu Hoshi, all of Shizuoka, Japan

[73] Assignee: Yamaha Corporation, Shizuoka-ken, Japan

[21] Appl. No.: 810,651

[22] Filed: Mar. 3, 1997

[30] Foreign Application Priority Data

Mar. 4, 1996 [JP] Japan .................. 8-075229

[51] Int. Cl.[6] ...................................... H01L 31/34
[52] U.S. Cl. .................. 438/55; 438/109; 136/201
[58] Field of Search ............... 438/55, 109; 136/201

[56] References Cited

U.S. PATENT DOCUMENTS

| | | | |
|---|---|---|---|
| 3,086,068 | 4/1963 | Charland et al. | 136/5 |
| 3,182,391 | 5/1965 | Charland et al. | 29/420.5 |
| 3,900,603 | 8/1975 | Rittmayer et al. | 427/124 |
| 4,447,277 | 5/1984 | Jayadev et al. | 148/400 |
| 4,491,679 | 1/1985 | Moore | 136/203 |
| 5,356,485 | 10/1994 | Kreider | 136/225 |

FOREIGN PATENT DOCUMENTS 1-276678  11/1989  Japan .

*Primary Examiner*—David Graybill
*Attorney, Agent, or Firm*—Ostrolenk, Faber, Gerb & Soffen, LLP

[57] ABSTRACT

A process wherein powder of p/n-type semiconductor thermoelectric materials expressed as $(Bi, Sb)_2(Te, Se)_3$ is hot pressed under the pressure equal to or greater than 400 kgf/cm$^2$ at 200 degrees to 400 degrees in centigrade for a time period between $\{(-T/5)+90\}$ minutes and 150 minutes or at 400 degrees to 500 degrees in centigrade for a time period between 5 minutes and 150 minutes so as to increase the figure of merit by virtue of the strain left in the crystal and/or micro crystal grain, and pieces of p/n-type semiconductor thermoelectric material are assembled with electrodes so as to obtain a thermoelectric module for a high thermoelectric conversion efficiency.

6 Claims, 8 Drawing Sheets

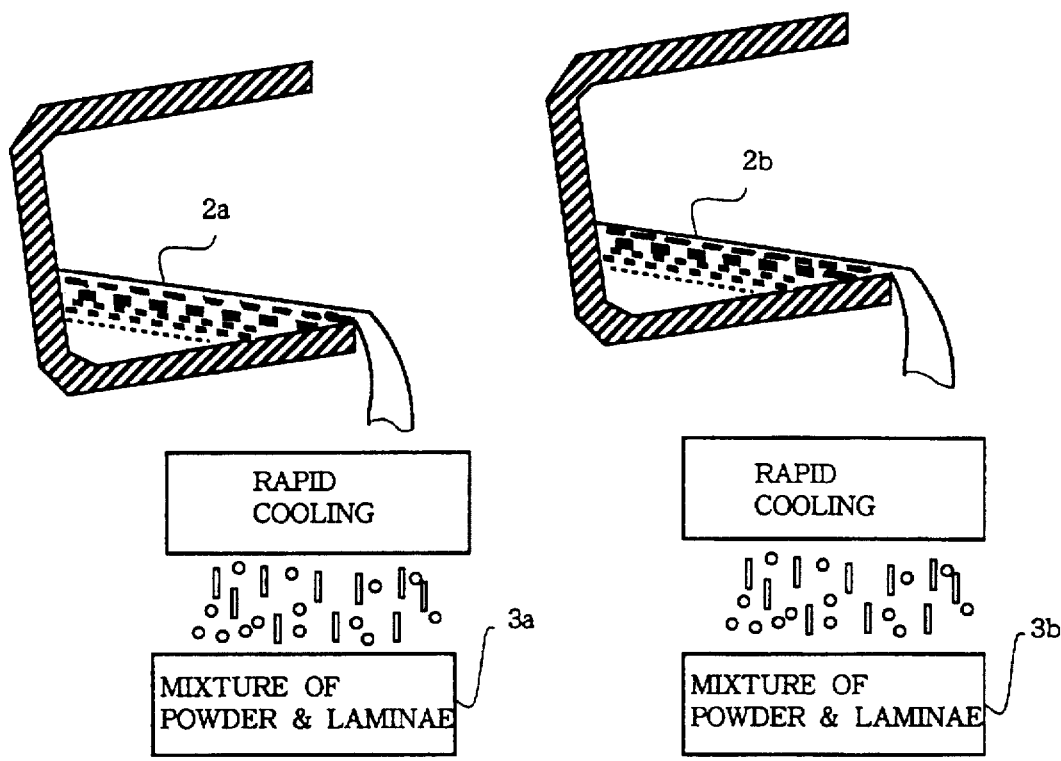
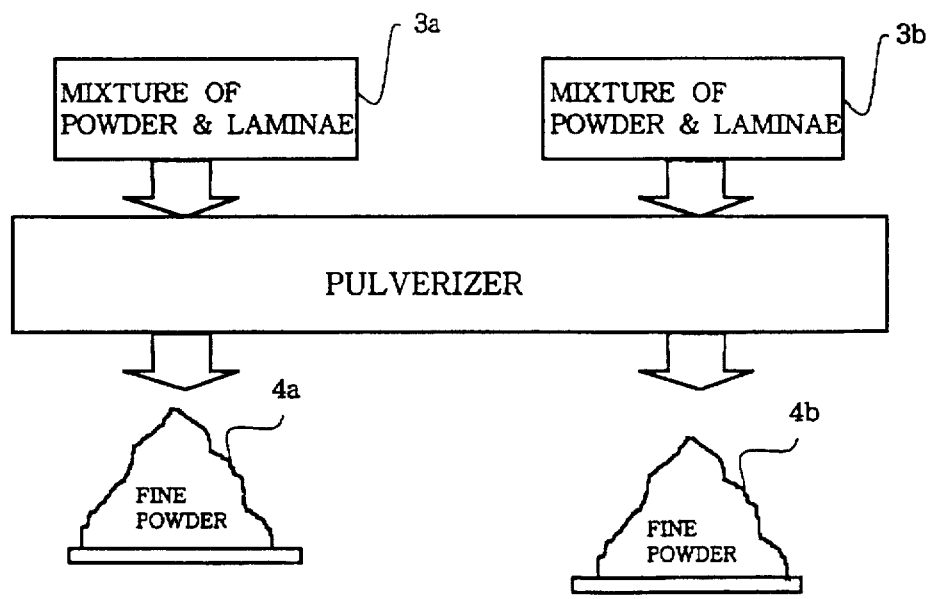
Fig. 1C
Fig. 1D

PROCESS OF FABRICATING A THERMOELECTRIC MODULE FORMED OF V-VI GROUP COMPOUND SEMICONDUCTOR INCLUDING THE STEPS OF RAPID COOLING AND HOT PRESSING

FIELD OF THE INVENTION

This invention relates to a thermoelectric module and, more particularly, to a thermoelectric module formed of V–VI group compound semiconductor.

DESCRIPTION OF THE RELATED ART

When different materials form a loop, two thermojunctions take place. If one of the thermojunctions is heated and the other is cooled, thermoelectric current flows through the loop due to the temperature difference between the two thermojunctions. This phenomenon is known as "Seebeck effect".

When direct current flows across the thermojunctions, an exoergic phenomenon and an endoergic phenomenon take place at the two junctions, respectively, and are called as "Peltier effect".

When current flows through a conductive path of a homogeneous material gradient in temperature, the endoergic phenomenon or the exoergic phenomenon takes place in the homogeneous material, and the phenomenon is known as "Thomson effect".

The Seebeck effect, the Peltier effect and the Thomson effect are reversible reactions categorized in the thermoelectric phenomenon. On the other hand, the Joule effect and the thermal conduction are irreversible phenomena, and these reversible and irreversible phenomena are available for a thermoelectric refrigeration.

The figure of merit $z$ represents the thermoelectric characteristics of the thermoelectric refrigerating material, and is expressed by Equation 1.

$$z = alpha^2 \ sigma/kappa \quad\quad 1$$

where alpha is Seebeck coefficient, sigma is electric conductivity and kappa is heat conductivity. A thermoelectric material with a large figure of merit is superior to another thermoelectric material with a small figure of merit.

A typical example of the thermoelectric material is V–VI group compound semiconductor material. The semiconductor thermoelectric material contains one or two elements selected from the first group consisting of Bi and Sb and one or two elements selected from the second group consisting of Te and Se, and the atomic ratio between the first group and the second group is adjusted to 2:3. Therefore, the prior art alloy is expressed as $(Bi, Sb)_2(Te, Se)_3$. The prior art semiconductor thermoelectric material is broken down into nine systems, i.e., Bi-Te system, Bi-Se system, Sb-Te system, Sb-Se system, Bi-Sb-Te system, Bi-Sb-Se system, Bi-Te-Se system, Sb-Te-Se system and Bi-Sb-Te-Se system.

The prior art thermoelectric module is produced as follows. First, Bi/Sb and Te/Se are scaled, and are mixed to the above described composition. Heat is applied, and the mixture is melted. The melt is cooled down. The cooling conditions are suitably controlled so as to obtain a single crystal alloy or a poly-crystalline alloy with grains unidirectionally oriented.

The semiconductor thermoelectric materials thus crystallized are shaped into a piece of p-type semiconductor thermoelectric material and a piece of n-type semiconductor thermoelectric material, and three electrodes are assembled with the piece of p-type semiconductor thermoelectric material and the piece of n-type semiconductor thermoelectric material. The first electrode is attached to one end of the p-type semiconductor thermoelectric material, and the second electrode is attached to one end of the n-type semiconductor thermoelectric material. The third electrode is connected between the other end of the piece of p-type semiconductor thermoelectric material and the other end of the piece of n-type semiconductor thermoelectric material. The thermoelectric module thus arranged has a pi-letter configuration.

A problem is encountered in the prior art thermoelectric module in that it has a low thermoelectric conversion efficiency. The figure of merit strongly affects the thermoelectric conversion efficiency. The figure of merit of the prior art semiconductor thermoelectric material is so small that the prior art thermoelectric module can not achieve a large thermoelectric conversion efficiency.

The present inventors had contemplated the small figure of merit, and noticed that the crystal grains were large. The heat conductivity was decreased together with the crystal grain size, and, accordingly, the figure of merit was increased by decreasing the crystal grain size.

A solution is disclosed in Japanese Patent Publication of Unexamined Application No. 1-276678. The Japanese Patent Publication of Unexamined Application proposes to rapidly cool the molten semiconductor thermoelectric material, and the semiconductor thermoelectric material is solidified in amorphous or micro-structure. The heat conductivity (kappa) is represented as $-\frac{1}{3} CvL(dt/dx)$ where C is specific heat, v is mean particle velocity and L is mean free path. The amorphous and the micro-structure have small mean free paths, and the heat conductivity becomes small. This results in a large figure of merit.

Thus, the rapid cooling achieves a fairly large figure of merit. However, the semiconductor thermoelectric material produced through the rapid cooling has a small mechanical strength in the cleavage.

The small mechanical strength would be improved by the sintering of the semiconductor thermoelectric powder pulverized from an ingot of the semiconductor thermoelectric material. However, if the thermal energy is too small, the semiconductor thermoelectric powder is hardly solidified. On the other hand, if the thermal energy is too large, the semiconductor thermoelectric material is recrystallized, and the figure of merit becomes small. In fact, the figure of merit of the prior art semiconductor thermoelectric material does not exceed $3.3 \times 10^{-3}/°K$.

SUMMARY OF THE INVENTION

It is therefore an important object of the present invention to provide a process of fabricating a thermoelectric module which achieves a large thermoelectric conversion efficiency.

The present invention proposes to shape semiconductor thermoelectric powder by using a hot pressing.

In accordance with the present invention, there is provided a process of fabricating a thermoelectric module, comprising: a) preparing molten semiconductor thermoelectric materials each containing at least one first element selected from the group consisting of bismuth and antimony and at least one second element selected from the group consisting of tellurium and selenium; b) rapidly cooling the molten semiconductor thermoelectric materials so as to solidify one of the semiconductor thermoelectric materials and another of the semiconductor thermoelectric materials into a first mixture of powder and laminae of a first conductivity type and a second mixture of powder and laminae of a second conductivity type opposite to the first conductivity type; c) pulverizing the first mixture and the second mixture so as to obtain a first fine powder of the first conductivity type and a second fine powder of the second conductivity type; d) shaping the first fine powder and the second fine powder into first pieces of semiconductor thermoelectric material of the first conductivity type and second pieces of semiconductor thermoelectric material of the second conductivity type by using a hot pressing under the conditions where the grains of the semiconductor thermoelectric materials are prevented from enlargement; and e) assembling the first pieces of semiconductor thermoelectric material and the second pieces of semiconductor thermoelectric material with electrodes so as to obtain a thermoelectric module.

The rapid cooling results in a semiconductor thermoelectric materials in amorphous phase, microstructure or non-equilibrium phase. Strain is introduced into the semiconductor thermoelectric material in the non-equilibrium phase. For this reason, the semiconductor thermoelectric materials hardly increases the grain during the recrystallization. Moreover, the first mixture and the second mixture are produced into the first fine powder and the second fine powder during the pulverization step, and the first fine powder and the second fine powder improve the mechanical strength of the pieces of semiconductor thermoelectric materials.

The hot pressing shapes the first fine powder and the second fine powder into the pieces of semiconductor thermoelectric materials without enlargement of the grain size. This results in small heat conductivity, and the small heat conductivity improves the figure of merit. As a result, the thermoelectric module according to the present invention is improved in thermoelectric conversion efficiency.

BRIEF DESCRIPTION OF THE DRAWINGS

The features and advantages of the process according to the present invention will be more clearly understood from the following description taken in conjunction with the accompanying drawings in which:

FIGS. 1A to 1F are schematic views showing a process of fabricating a thermoelectric module according to the present invention;

DESCRIPTION OF THE PREFERRED EMBODIMENT

Figure 1A:
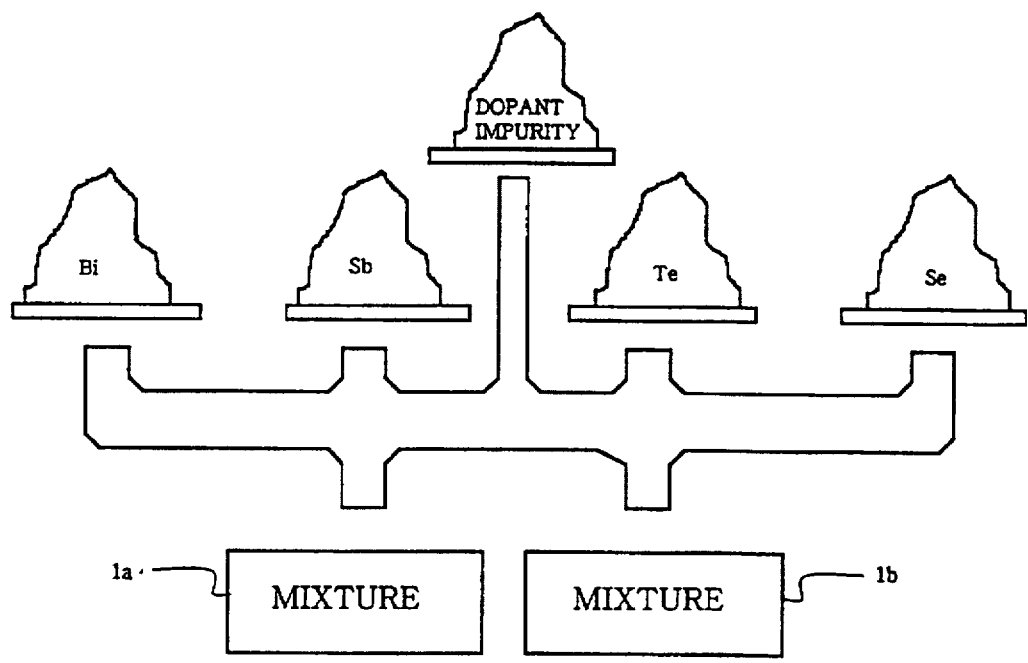

FIGS. 1A to 1F illustrate a process of fabricating a thermoelectric module embodying the present invention. Powder of bismuth and/or antimony and powder of tellurium and/or selenium are scaled, and are mixed into a composition of $(Bi, Sb)_2(Te, Se)_3$. $Bi_2Te_3$ is, by way of example, the p-conductivity type at room temperature; however, dopant impurity such as, for example, Se, Te or Sb changes the conductivity type. Thus, the mixture 1a for a p-type semiconductor thermoelectric material and another mixture 1b for an n-type semiconductor thermoelectric material are prepared as shown in FIG. 1A.

Figure 1B:
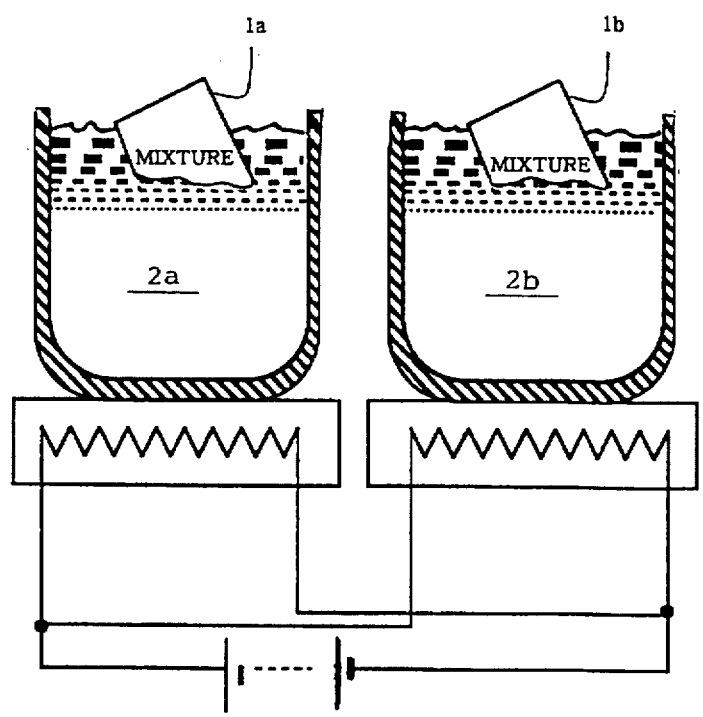

Subsequently, the mixture 1a for the p-type semiconductor thermoelectric material and the mixture 1b for the n-type semiconductor thermoelectric material are separately melted as shown in FIG. 1B, and the molten semiconductor thermoelectric materials 2a and 2b are rapidly cooled by using a melt quenching technique at $10^4$ to $10^6$ ° K./second. A single rolling process, a double rolling process or a gas atomizing process is available for the rapid quenching. When the molten thermoelectric materials are subjected to the melt quenching, mixture 3a of powder and laminae of the p-type semiconductor thermoelectric material and mixture 3b of powder and laminae of the n-type semiconductor thermoelectric material are obtained as shown in FIG. 1C.

Subsequently, the mixture 3a of powder and laminae and the mixture 3b of powder and laminae are pulverized so as to obtain fine powder 4a of the p-type semiconductor thermoelectric material and fine powder 4b of the n-type semiconductor thermoelectric material as shown in FIG. 1D. The average grain size or the mean diameter of the fine powder 4a/4b is equal to or less than 300 microns. The mean diameter of the fine powder 4a/4b is preferably equal to or less than 53 microns.

Figure 1E:
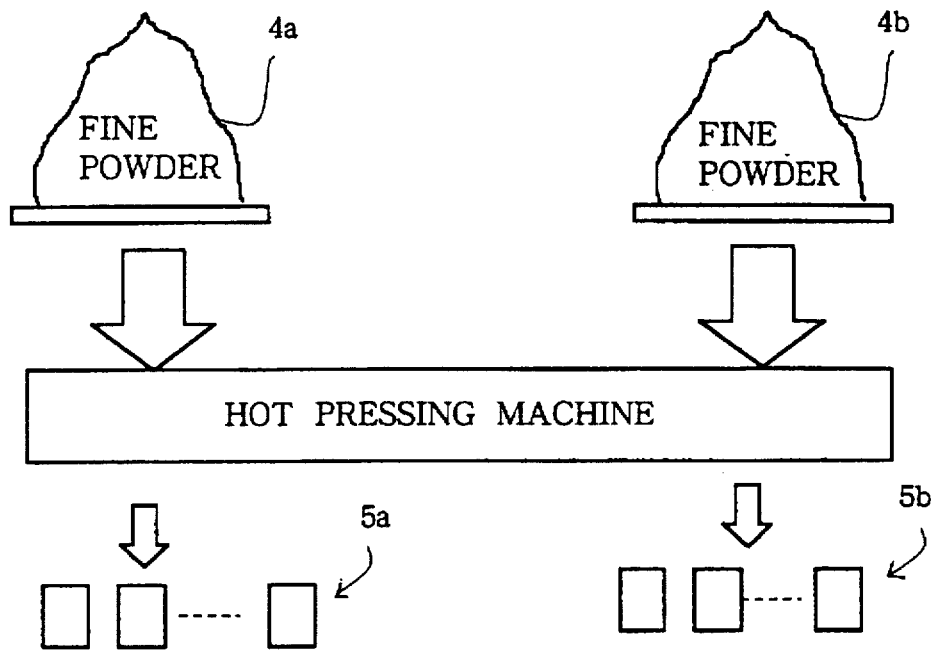
Figure 1F:
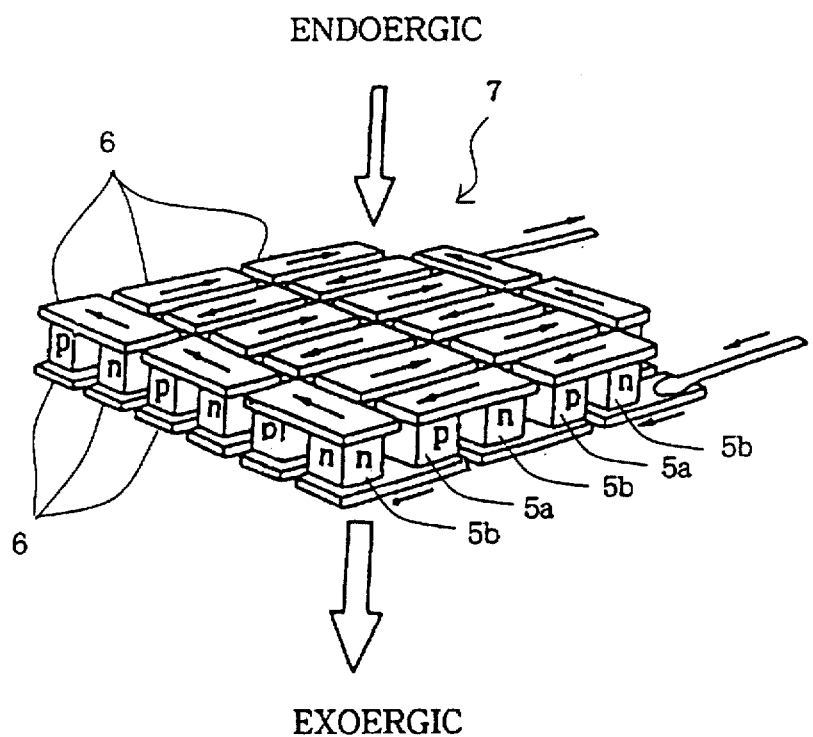

The fine powder 4a of the p-type semiconductor thermoelectric material and the fine powder 4b of the n-type semiconductor thermoelectric material are separately hot pressed into pieces 5a of the p-type semiconductor thermoelectric material and pieces 5b of the n-type semiconductor thermoelectric material as shown in FIG. 1E.

The conditions of the hot pressing are as follows. Pressure equal to or greater than 400 kgf/cm$^2$ is applied to the fine powder 4a of the p-type semiconductor thermoelectric material and the fine powder 4b of the n-type semiconductor thermoelectric material, is maintained at a temperature $\underline{T}$ for a time period $\underline{t}$. When the temperature T ranges between 200 degrees to 400 degrees centigrade, i.e., $200 \leq T \leq 400$, the time period $\underline{t}$ falls within the range expressed by inequality 1.

$$-T/5+90 \leq t \leq 150 \qquad \text{Inequality 1}$$

When the temperature $\underline{T}$ is higher than 400 degrees in centigrade but not higher than 500 degrees in centigrade, i.e., $400 < T \leq 500$, the time period $\underline{t}$ satisfies inequality 2.

$$5 \leq t \leq 150 \qquad \text{Inequality 2}$$

Figure 2:
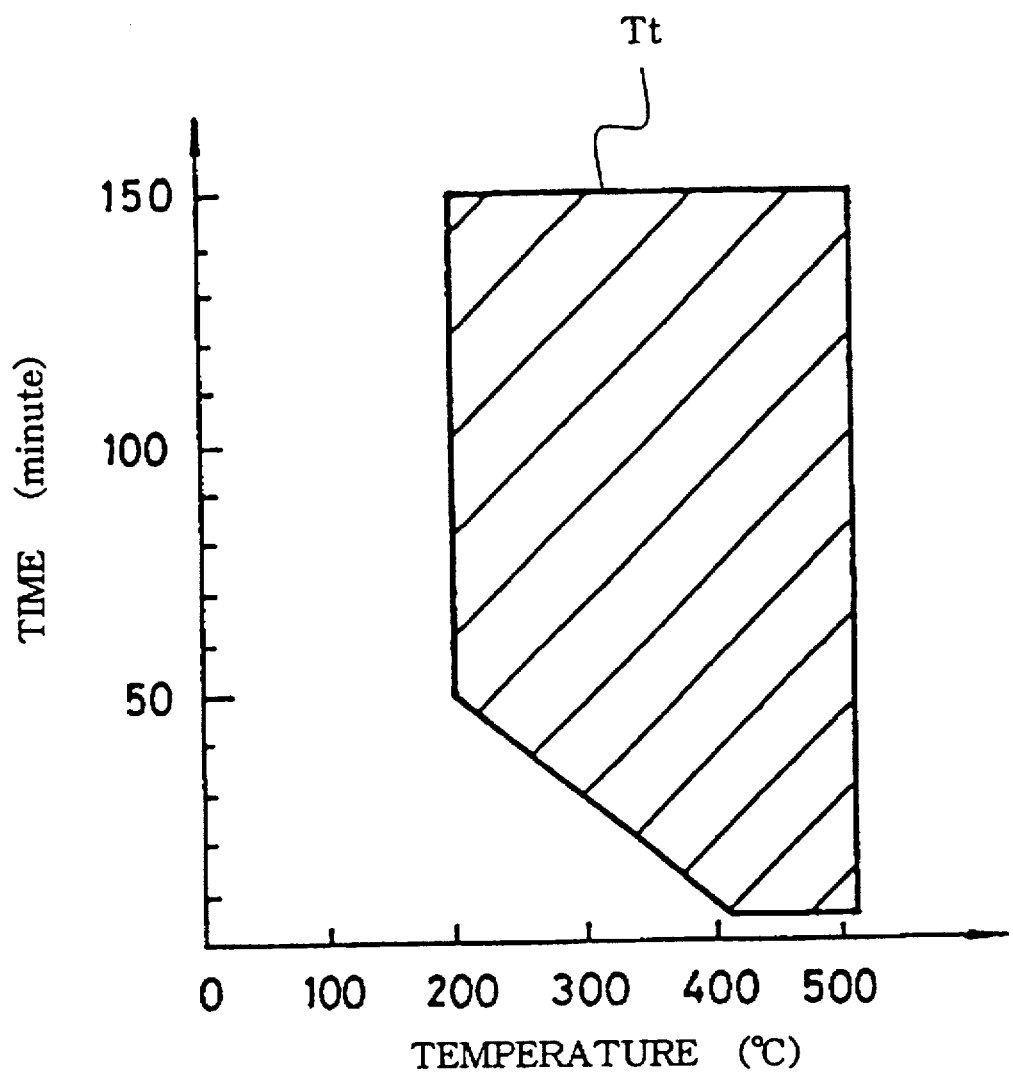
FIG. 2 is a graph showing a relation between temperature and time in a hot pressing according to the present invention.

In inequalities 1 and 2, the time period $\underline{t}$ is given in minute, and FIG. 2 illustrates the relation between the temperature $\underline{T}$ and the time period $\underline{t}$. The time/temperature conditions according to the present invention are indicated by the hatched region Tt in FIG. 2.

Figure 3:
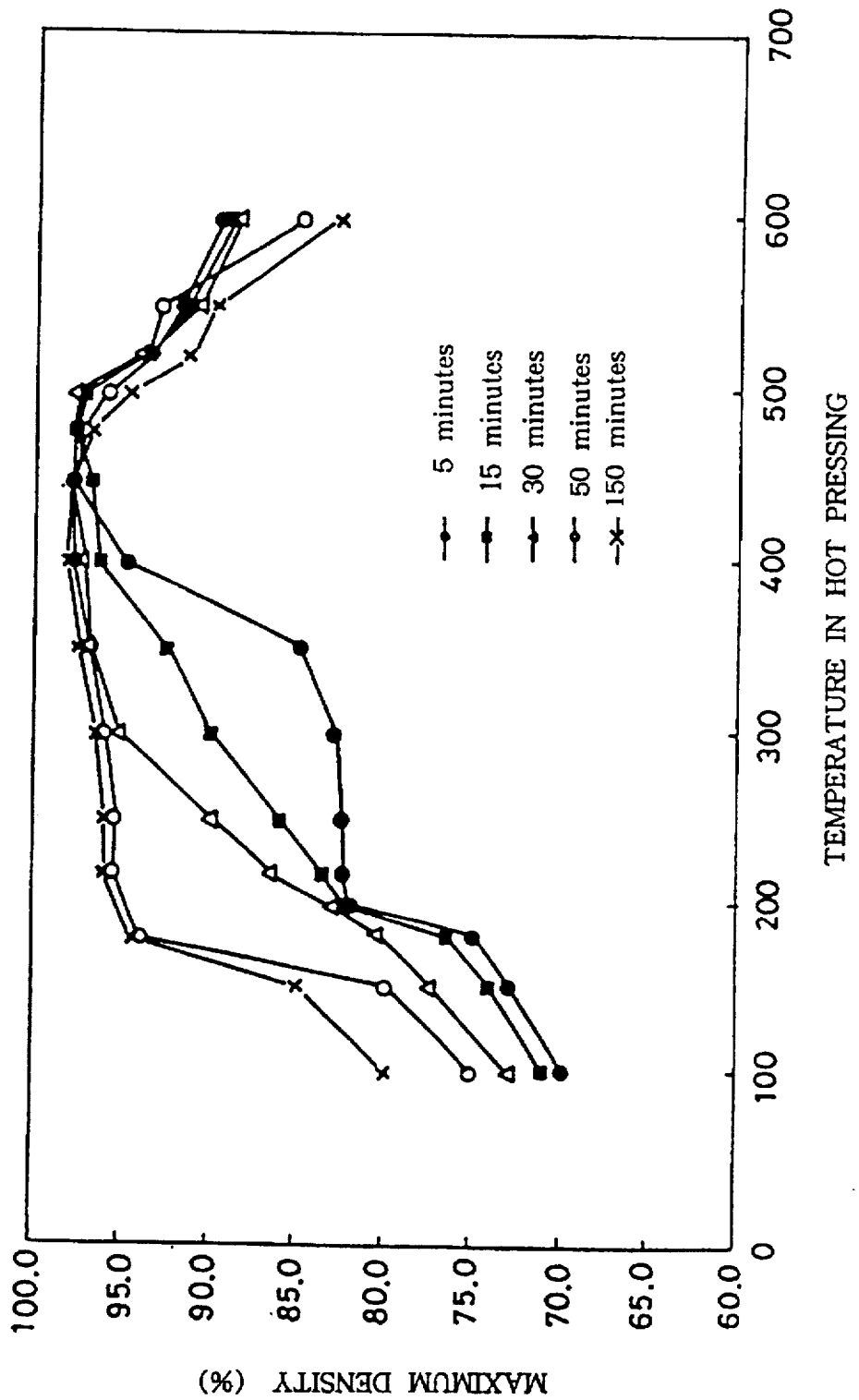
FIG. 3 is a graph showing relation between a temperature in hot pressing and the maximum density achieved under 400 kgf/cm$^2$.

The hatched region Tt is derived from the experimental results shown in FIG. 3. The experiment was carried out under the pressure of 400 kgf/cm$^2$, and the temperature and the time ranged between 100 degrees to 600 degrees in centigrade and between 5 minutes to 150 minutes, respectively. Plots of FIG. 3 teach us that the time/temperature conditions set a limit to the maximum density. When the temperature was too low, the powder was insufficiently solidified, and, accordingly, the maximum density was low.

This means that the product is brittle. On the other hand, when the temperature was too high, although the powder was solidified, the component elements were partially eliminated, and the elimination lowered the maximum density.

When the hot pressing is carried out under the above described conditions, the fine powder 4a/4b is not recrystallized, and the grain size is kept small. Thus, the p-type semiconductor thermoelectric material and the n-type semiconductor thermoelectric material according to the present invention is small in grain size and, accordingly, small in heat conductivity. This results in a large figure of merit.

When the fine powder 4a/4b is shaped into the pieces 5a of the p-type semiconductor thermoelectric material and the pieces 5b of the n-type semiconductor thermoelectric material by using a sintering, the fine powder 4a/4b should be sintered at lower than a temperature for recrystallization of the thermoelectric material. If the fine powder is sintered at 400 degrees centigrade or less. The sintered product is also small in grain size, and is small in thermal conductivity.

Figure 4:
FIG. 4 is a photo-copy of a microphotograph showing the crystal structure of a comparative example out of the scope of the present invention.

FIG. 4 is a photo-copy of a microphotograph showing the crystal structure of a comparative example. The comparative example was formed of $Bi_2Te_3$, and was hot pressed at 550 degrees in centigrade for 10 minutes under the pressure of 500 kgf/cm². The comparative example was large in grain size, and the heat conductivity was 0.93 watt/m$\bar{N}$°K.

Figure 5:
FIG. 5 is a microphotograph showing the crystal structure of a piece of semiconductor thermoelectric material according to the present invention.

FIG. 5 is a photo-copy of a microphotograph showing the crystal structure of the piece of semiconductor thermoelectric material according to the present invention. The piece of semiconductor thermoelectric material was expressed as $Bi_{0.5}Sb_{1.5}Te_3$, and the fine powder was hot pressed at 450 degrees in centigrade for 10 minutes under the pressure of 8000 kgf/cm². The grain was miniature, and the heat conductivity was 1.08 watt/m$\bar{N}$°K.

Figure 6:
FIG. 6 is a microphotograph showing the crystal structure of a piece of another semiconductor thermoelectric material according to the present invention.

FIG. 6 is a photo-copy of a micro-photograph showing the crystal structure of the piece of another semiconductor thermoelectric material according to the present invention. The piece of semiconductor thermoelectric material was expressed as $Bi_{0.5}Sb_{1.5}Te_3$, and the fine powder was hot pressed at 350 degrees in centigrade for 80 minutes under the pressure of 8000 kgf/cm². The grain was miniature, and the heat conductivity was 0.93 watt/m$\bar{N}$°K.

Thus, the pieces 5a of the p-type semiconductor thermoelectric material and the pieces 5b of the n-type semiconductor thermoelectric material are small in heat conductivity and, accordingly, large in figure of merit.

The present inventors changed the composition and the conditions of hot pressing, and measured the average grain size, i.e., the mean diameter in micron and the heat conductivity at room temperature. Table reports the mean diameter, the heat conductivity, the conditions of hot pressing and the figure of merit.

Specimens 1 to 10 fall within the scope of the present invention. On the other hand, specimens 11 to 16 were out of the technical scope of the present invention. Specimens 11 to 16 were hot pressed under the conditions out of the present invention, and larger energy or smaller energy was supplied to the powder.

TABLE

| Specimen | Composition | Mean dia. micrometer | Thermal conduc. w/mk | Hot press °C. × min. | Figure of merit $10^{-3}$/k |
|---|---|---|---|---|---|
| 1 | $Bi_{0.5}Sb_{1.5}Te_3$ | 4.4 | 1.08 | 450 × 10 | 4.3 |
| 2 | $Bi_{0.5}Sb_{1.5}Te_3$ | 1.2 | 0.93 | 350 × 80 | 4.1 |
| 3 | $Bi_2Te_3$ | 4.8 | 1.20 | 350 × 80 | 3.4 |
| 4 | $Bi_{0.5}Sb_{1.5}Te_{2.9}(Se)$ | 1.1 | 1.12 | 350 × 80 | 3.8 |
| 5 | $Bi_{0.5}Sb_{1.5}Te_{2.8}(Se)$ | 1.2 | 1.20 | 350 × 80 | 3.8 |
| 6 | $BiSbTe_3(PbI_2)$ | 1.0 | 1.20 | 350 × 80 | 3.7 |
| 7 | $Bi_2Te_{2.85}(Se)$ | 1.7 | 1.28 | 350 × 80 | 3.5 |
| 8 | $Bi_{0.8}Sb_{0.2}Te_{2.85}(Se)$ | 1.5 | 1.20 | 350 × 80 | 3.7 |
| 9 | $Bi_2Te_{2.85}(Se)$ | 1.9 | 1.20 | 350 × 80 | 3.6 |
| 10 | $Bi_{1.8}Sb_{0.2}Te_{2.85}Se_{0.15}(SbI_3)$ | 0.9 | 1.28 | 350 × 80 | 3.4 |
| 11 | $Bi_{0.5}Sb_{1.5}Te_3$ | 60 | 1.47 | 530 × 10 | 2.0 |
| 12 | $Bi_{0.5}Sb_{1.5}Te_3$ | 250 | 1.88 | 530 × 180 | 1.7 |
| 13 | $Bi_{0.5}Sb_{1.5}Te_3$ | | * | 180 × 180 | — |
| 14 | $Bi_2Te_3$ | 65 | 1.51 | 530 × 10 | 1.9 |
| 15 | $Bi_2Te_3$ | 300 | 1.95 | 530 × 180 | 1.8 |
| 16 | $Bi_2Te_3$ | | * | 180 × 180 | — |

In the table, * means that solidification is impossible. As will be understood from Table 1, the thermoelectric materials, i.e., specimens 1 to 10 according to the present invention are small in thermal conductivity by virtue of the small grain size, the amorphous phase and/or the non-equilibrium phase with strain, and, accordingly, achieve the large figure of merit ranging from $3.4\times10^{-3}$/°K. to $4.3\times10^{-3}$/°K. However, the prior art thermoelectric materials, i.e., specimens 11 to 16 are large in thermal conductivity, and the figure of merit ranges from $1.7\times10^{-3}$/°K. to $2.0\times10^{-3}$/°K.

For example, specimens 11 and 12 were hot pressed at 530 degrees in centigrade, and the grain size was much larger than those of specimens 1 to 10. Specimen 12 was hot pressed during the time longer than that of specimen 11. The longer the time, the larger the gain size.

Turning back to FIGS. 1A to 1F, the pieces 5a of the p-type semiconductor thermoelectric material and the pieces 5b of the n-type semiconductor thermoelectric material are soldered to electrodes 6 of copper or silver in such a manner as to be connected in series as shown in FIG. 1F. Soldering conditions are as follows. $Bi_{58}Sn_{42}$ is inserted between the thermoelectric material and the electrodes 6, and is preheated to 115 degrees in dentigrade for 90 seconds. Thereafter, the solder is reflowed at 160 degrees in centgirade for 3 seconds.

Thus, the pieces 5a of the p-type semiconductor thermoelectric material, the pieces 5b of the n-type semiconductor thermoelectric material and the electrodes 6 are assembled into a thermoelectric module 7, and current flows through the electrodes 6 as indicated by allows.

Peltier element is usually evaluated with the maximum temperature difference (delta-Tmax) and the maximum endoergic quantity. When the figure of merit is $3.4 \times 10^{-3}/°K$, the Peltier element achieves the maximum temperature difference more than 70° K. and the maximum endoergic quantity more than 8 watt/ cm². When the Peltier element is expected to produce temperature difference of 10° K., the power consumption was reduced at 30 percent with respect to the Peltier element presently available.

Although particular embodiments of the present invention have been shown and described, it will be obvious to those skilled in the art that various changes and modifications may be made without departing from the spirit and scope of the present invention.

What is claimed is:

1. A process of fabricating a thermoelectric module, comprising:

a) preparing molten semiconductor thermoelectric materials each containing at least one first element selected from the group consisting of bismuth and antimony and at least one second element selected from the group consisting of tellurium and selenium;

b) rapidly cooling said molten semiconductor thermoelectric materials so as to solidify one of said semiconductor thermoelectric materials and another of said semiconductor thermoelectric materials into a first mixture of powder and laminae of a first conductivity type and a second mixture of powder and laminae of a second conductivity type opposite to said first conductivity type;

c) pulverizing said first mixture and said second mixture so as to obtain a first fine powder of said first conductivity type and a second fine powder of said second conductivity type;

d) shaping said first fine powder and said second fine powder into first pieces of semiconductor thermoelectric material of said first conductivity type and second pieces of semiconductor thermoelectric material of said second conductivity type by using a hot pressing under the conditions where the grains of said semiconductor thermoelectric materials are prevented from enlargement; and e) assembling said first pieces of semiconductor thermoelectric material and said second pieces of semiconductor thermoelectric material with electrodes so as to obtain a thermoelectric module.

2. A process of fabricating a thermoelectric module, comprising:

a) preparing molten semiconductor thermoelectric materials each containing at least one first element selected from the group consisting of bismuth and antimony and at least one second element selected from the group consisting of tellurium and selenium;

b) rapidly cooling said molten semiconductor thermoelectric materials so as to solidify one of said semiconductor thermoelectric materials and another of said semiconductor thermoelectric materials into a first mixture of powder and laminae of a first conductivity type and a second mixture of powder and laminae of a second conductivity type opposite to said first conductivity type;

c) pulverizing said first mixture and said second mixture so as to obtain a first fine powder of said first conductivity type and a second fine powder of said second conductivity type;

d) shaping said first fine powder and said second fine powder into first pieces of semiconductor thermoelectric material of said first conductivity type and second pieces of semiconductor thermoelectric material of said second conductivity type by using a hot pressing under the conditions, in which when a temperature ranges from 200 degrees to 400 degrees in centigrade, a pressure equal to or greater than 400 kgf/cm² is applied to said first fine powder and said second fine powder for a first time expressed as $$(-T/5)+90 < t1 \leq 150$$

where T is said temperature and t is said first time in minute, when said temperature is higher than 400 degrees in centigrade but not higher than 500 degrees in centigrade, said pressure is applied to said first powder and said second powder for a second time ranging between 5 minutes to 150 minutes; and e) assembling said first pieces of semiconductor thermoelectric material and said second pieces of semiconductor thermoelectric material with electrodes so as to obtain a thermoelectric module.

3. The process as set forth in claim 2, in which the rapid cooling at said step b) is carried out under a quenching velocity ranging from $10^{4°}$ K. per second to $10^{6°}$ K. per second.

4. The process as set forth in claim 3, in which said quenching velocity is achieved by using a melt quenching technique.

5. The process as set forth in claim 2, in which a mean diameter of said first fine powder and said second fine powder is equal to or less than 300 microns in mean diameter.

6. The process as set forth in claim 2, in which a mean diameter of said first fine powder and said second fine powder is equal to or less than 53 microns in mean diameter.

* * * * *